United States Patent
Zhu

(10) Patent No.: US 10,424,418 B2
(45) Date of Patent: Sep. 24, 2019

(54) BACK SURFACE FIELD ALUMINUM PASTE FOR POINT CONTACTS OF EFFICIENT BIFACIAL CRYSTALLINE SILICON SOLAR CELLS AND PREPARATION METHOD THEREOF

(71) Applicant: NANTONG T-SUN NEW ENERGY CO., LTD., Nantong Jiangsu (CN)

(72) Inventor: Peng Zhu, Nantong Jiangsu (CN)

(73) Assignee: Nantong T-Sun New Energy Co., Ltd., Nantong, Jiangsu (CN)

( * ) Notice: Subject to any disclaimer, the term of this patent is extended or adjusted under 35 U.S.C. 154(b) by 0 days.

(21) Appl. No.: 15/571,148

(22) PCT Filed: Apr. 13, 2017

(86) PCT No.: PCT/CN2017/080433
§ 371 (c)(1),
(2) Date: Nov. 1, 2017

(87) PCT Pub. No.: WO2018/040570
PCT Pub. Date: Mar. 8, 2018

(65) Prior Publication Data
US 2018/0268954 A1 Sep. 20, 2018

(30) Foreign Application Priority Data

Aug. 30, 2016 (CN) .......................... 2016 1 0753538

(51) Int. Cl.
*H01B 1/02* (2006.01)
*H01B 1/20* (2006.01)
*H01B 1/22* (2006.01)
*H01B 1/16* (2006.01)
*H01L 31/0224* (2006.01)

(52) U.S. Cl.
CPC ................. *H01B 1/22* (2013.01); *H01B 1/16* (2013.01); *H01L 31/022425* (2013.01); *H01L 31/022441* (2013.01)

(58) Field of Classification Search
CPC ............... H01B 1/02; H01B 1/20; H01B 1/22
See application file for complete search history.

(56) References Cited

U.S. PATENT DOCUMENTS

| 9,263,169 | B2 * | 2/2016 | Lee ......................... H01B 1/22 |
| 2010/3007802 | | 12/2010 | Yamamoto |
| 2017/0141248 | A1 * | 5/2017 | Song ........................ H01B 1/22 |

FOREIGN PATENT DOCUMENTS

| CN | 101425545 | | 5/2009 |
| CN | 101728439 | | 6/2010 |
| CN | 103199128 | A * | 7/2013 |
| CN | 106328726 | | 1/2017 |

OTHER PUBLICATIONS

Machine translation of CN103199128.*

* cited by examiner

*Primary Examiner* — Haidung D Nguyen
(74) *Attorney, Agent, or Firm* — Rankin, Hill & Clark LLP

(57) ABSTRACT

A back surface field aluminum paste for point contacts of efficient bifacial crystalline silicon solar cells and its preparation method is disclosed. The aluminum paste, which is used to cover the notched area in the back surface of a bifacial passivated solar cell, and not to cover the entire area covered by a back surface passivation film, comprises 85-95 parts by weight of aluminum powder, 10-15 parts by weight of organic carrier and 0.1-6 parts by weight of inorganic binder. The organic carrier includes thickening agent, thixotropic agent, dispersing agent and solvent. Sintered aluminum gate lines have a certain height to width ratio.

5 Claims, No Drawings

BACK SURFACE FIELD ALUMINUM PASTE FOR POINT CONTACTS OF EFFICIENT BIFACIAL CRYSTALLINE SILICON SOLAR CELLS AND PREPARATION METHOD THEREOF

FIELD OF THE INVENTION

The invention relates to solar cells, and more particularly, to a back surface field aluminum paste for point contacts of efficient bifacial crystalline silicon solar cells and its preparation method.

BACKGROUND OF THE INVENTION

The entire back surface of a conventional crystalline silicon solar cell is usually printed with aluminum paste. There are some weaknesses in the all-aluminum back surface field structure, such as low back surface reflectivity, weak long wavelength photon absorption, and high recombination rate of photo-induced charge carriers at the back surface of a solar cell, and thus, the electrical performance of a solar cell is affected by these weaknesses. Improving the quality of surface passivation and decreasing the surface recombination rate have become main methods to improve the efficiency of the solar cells. PERC (Passivated Emitter Rear Contact) silicon solar cells are a special type of conventional crystalline silicon solar cells, characterized in that medium passivation layers exist both on the front surfaces and on the back surfaces of the solar cells.

As for efficient bifacial point contact crystalline silicon solar cells, laser technology is used to notch on the back surface medium layer, so as to bare filiform or punctiform silicon substrate. Aluminum paste is screen printed on the notched area of the medium layer, while the entire back surface is not covered by the aluminum paste.

SUMMARY OF THE INVENTION

The object of the invention: the present invention is to provide a back surface field aluminum paste for point contacts in efficient bifacial crystalline silicon solar cells and its preparation method. The aluminum paste is characterized in that it has good printability, the sintered aluminum gate lines have a certain height to width ratio, and it is capable of forming good ohmic contact at point contacts in a solar cell.

Technical Scheme: in order to attain the above object, the invention provide a back surface field aluminum paste for point contacts of efficient bifacial crystalline silicon solar cells and its preparation method. The aluminum paste comprises 85-95 parts by weight of aluminum powder, 10-15 parts by weight of organic carrier and 0.1-6 parts by weight of inorganic binder.

Preferably, the particle size D50 of the aluminum powder is 0.3-0.8 μm, and the tap density of the aluminum powder is 1-3 g/cm$^3$.

Preferably, the organic carrier comprises thickening agent, thixotropic agent, additive and solvent; the thickening agent is one or more members of the group consisting of xylene resin, cellulose acetate propionate, cellulose acetate butyrate, phenolic modified cellulose, acrylic resin and nitro cellulose, and preferably, the thickening agent is acrylic resin; the thixotropic agent is one or two members of the group consisting of polyamide wax, polyethylene wax and organic bentonite; the additive is BYK2009 or coupling agent KH-570; the solvent is one or two members of the group consisting of terpineol, butyl carbitol, propylene glycol monomethyl ether acetate, texanol and petroleum ether.

Preferably, the mixed inorganic binder is made by ball milling and drying processes from glass powder with a certain softening temperature, nanosized zinc powder and nanosized molybdenum oxide; the glass powder is bismuthate glass powder with particle sizes of 1-5 μm and a softening temperature in the range of 450-500° C.; the nanosized zinc powder has a purity of more than 99.6% and particle sizes of 20-80 nm; the nanosized molybdenum oxide has a purity more than 99.6% and particle sizes of 60-100 nm; the mixed inorganic binder comprises 85-95 parts by weight of bismuthate, 1-10 parts by weight of nanosized zinc powder and 1-10 nanosized molybdenum oxide.

Compared with the existing technologies in the art, the invention has the following beneficial effects:

Acrylic resin as a thickening agent in the organic carrier can improve the viscosity of the aluminum paste; Polyamide wax, polyethylene wax and organic bentonite provide thixotropy to the aluminum paste; terpineol, butyl carbitol, propylene glycol monomethyl ether acetate, texanol and petroleum ether provide flowability to the aluminum paste; The coupling agent KH-570 provides plasticity to the aluminum paste. The combined use of the above raw materials provides the aluminum paste with a balanced flowability, plasticity and thixotropy, makes the aluminum paste propitious to printing, and thus forms aluminum gate lines with a certain height to width ratio.

Nanosized zinc powder is used in the mixed inorganic binder. Because the nanosized zinc powder has higher activity, the nanosized zinc powder is filled into the aluminum powder gap, a more dense conductive layer is formed, and thus the electrical properties of the solar cell is improved. On the other hand, the oxidation of zinc powder forms zinc oxide, which can not only increase the wettability of glass powder, but also play a role in fluxing. The use of nanosized molybdenum oxide in the mixed inorganic binder mainly plays a role in improving the thermal stability, chemical stability and mechanical strength of the glass powder.

The preparation method of the aluminum paste in the invention includes the following steps:

85-95 parts by weight of aluminum powder, 10-15 parts by weight of organic carrier and 0.1-6 parts by weight of inorganic binder are weighed, mixed, dispersed with a dispersion machine at a speed of 500-2000 rpm for 1 h, grinded with a three-roller grinding machine to a fineness less than 8 μm, and the viscosity of the paste is controlled within 80-100 Pa·s, which is measured with a Brookfield DV2T viscometer at 25° C.

The aluminum paste obtained as above is screen printed on notched areas in the back surface of a passivated wafer, with the use of a 156 mm×156 mm 400 mesh screen; after being sintered, the aluminum gate line width is within 50-100 μm and aluminum gate line height is within 18-25 μm. The notched areas are covered with the aluminum paste, while the entire back surface passivation film is not covered. The printed wafer is dried in a 250° C. oven. After being dried, the aluminum gate lines do not drop off. Then a front surface field silver paste is printed on the other side of the wafer, and sintered with a sintering peak temperature of 700-800° C., so as to form a partial back surface field (BSF) layer on the exposed areas of the medium passivation layer.

Beneficial Effects: The aluminum paste of the invention has good printability, and the sintered aluminum gate lines have a certain height to width ratio, and it is capable of forming good ohmic contact at point contacts with the silicon substrate in a solar cell. In the invention, the absorption of the solar light by the solar cells is increased, the red light response is improved, and furthermore, the recombination of charge carriers at the back surface is effectively reduced. As a result, the photoelectric conversion efficiency of the solar cells is greatly improved.

The organic carrier comprises thickener, thixotropic agent, additive and solvent, so that the aluminum paste has good printability, and the sintered aluminum gate lines has a certain height to width ratio. In addition, addition of a mixed inorganic binder into the aluminum paste makes the aluminum layer at the point contacts form a good ohmic contact with the silicon substrate. The mixed inorganic binder is made from glass powder with a certain softening temperature, ultrafine nanosized zinc powder and nanosized molybdenum oxide.

DETAILED DESCRIPTION OF THE PREFERRED EMBODIMENTS

The present invention is described in detail with some embodiments. The protection scope of the invention is not limited to the following embodiments.

Embodiment 1

A highly filled aluminum paste used for back surface field point contact in PERC cells comprises 85 parts by weight of aluminum powder, 12.5 parts by weight of organic carrier and 2.5 parts by weight of inorganic binder.

The organic carrier comprises 3 parts by weight of acrylic resin, 0.5 part by weight of organic bentonite as thixotropic agent, 0.06 part by weight of BYK2009 as additive, 0.24 part by weight of coupling agent KH-570, 50 parts by weight of terpineol, 20 parts by weight of propylene glycol monomethyl ether acetate, 20 parts by weight of texanol and 6.2 parts by weight of petroleum ether.

The mixed inorganic binder comprises 85 parts by weight of bismuthate glass, 10 parts by weight of nanosized zinc powder and 5 parts by weight of molybdenum oxide. The softening temperature of the glass powder is within 450-500 V.

The preparation method of the above aluminum paste includes the following steps:

The aluminum powder, the organic carrier and the mixed inorganic are weighed according to the above-mentioned proportion, mixed, dispersed with a dispersion machine at a speed of 500-1000 rpm for 1 h, grinded with a three-roller grinding machine to a fineness less than 8 and the viscosity of the paste is controlled within 85-95 Pa·s, which is measured with a Brookfield DV2T viscometer at 25° C.

The aluminum paste obtained as above is screen printed on notched areas in the back surface of a passivated wafer with the use of a 156 mm×156 mm 400 mesh screen; the notched areas are covered with the aluminum paste, while the entire back surface passivation film is not covered. The printed wafer is dried in a 250° C. oven. After being dried, the aluminum gate lines do not drop off. Then a front surface field silver paste is printed on the other side of the wafer, and sintered in a muffle furnace with a sintering peak temperature of 700-800° C., so as to form a partial back surface field (BSF) layer on the exposed areas of the medium passivation layer.

Embodiment 2

A highly filled aluminum paste used for back surface field point contact in PERC cells comprises 88 parts by weight of aluminum powder, 10 parts by weight of organic carrier and 2 parts by weight of inorganic binder.

The organic carrier comprises 3 parts by weight of acrylic resin, 0.5 part by weight of polyethylene wax as thixotropic agent, 0.06 part by weight of BYK2009 as additive, 0.24 part by weight of coupling agent KH-570, 50 parts by weight of terpineol, 20 parts by weight of propylene glycol monomethyl ether acetate, 20 parts by weight of texanol and 6.2 parts by weight of petroleum ether.

The mixed inorganic binder comprises 90 parts by weight of bismuthate glass, 7 parts by weight of nanosized zinc powder and 3 parts by weight of molybdenum oxide.

The related preparation steps are the same as embodiment 1.

Embodiment 3

A highly filled aluminum paste used for back surface field point contact in PERC cells comprises 88 parts by weight of aluminum powder, 10 parts by weight of organic carrier and 1.5 parts by weight of inorganic binder.

The organic carrier comprises 2.5 parts by weight of phenolic modified cellulose, 0.5 part by weight of polyamide modified lauryl phosphate as thixotropic agent, 0.06 part by weight of BYK2009 as additive, 0.24 part by weight of coupling agent KH-570, 50 parts by weight of terpineol, 15 parts by weight of propylene glycol monomethyl ether acetate, 25 parts by weight of texanol and 6.9 parts by weight of petroleum ether.

The mixed inorganic binder comprises 90 parts by weight of bismuthate glass, 5 parts by weight of nanosized zinc powder and 5 parts by weight of molybdenum oxide. The softening temperature of glass powder is within 450-500° C.

The related preparation steps are the same as embodiment 1.

Embodiment 4

A highly filled aluminum paste used for back surface field point contact in PERC cells comprises 90 parts by weight of aluminum powder, 8.5 parts by weight of organic carrier and 1.5 parts by weight of inorganic binder.

The organic carrier comprises 2 parts by weight of phenolic modified cellulose, 0.6 part by weight of polyamide wax as thixotropic agent, 0.06 part by weight of BYK2009 as additive, 0.24 part by weight of coupling agent KH-570, 50 parts by weight of terpineol, 15 parts by weight of propylene glycol monomethyl ether acetate, 25 parts by weight of texanol and 7 parts by weight of petroleum ether.

The mixed inorganic binder comprises 88 parts by weight of bismuthate glass, 7 parts by weight of nanosized zinc powder and 5 parts by weight of molybdenum oxide. The softening temperature of glass powder is within 450-500° C.

The related preparation steps are the same as embodiment 1.

The invention is not limited to the above preferred embodiments. Various other products made with the identical or similar technologies disclosed in the invention by persons skilled in the art who are enlightened from the invention, no matter any modifications or changes in shape or structure, are within the scope of the invention.

I claim:

1. A back surface field aluminum paste for point contacts of efficient bifacial crystalline silicon solar cells, comprising:
    85-95 parts by weight of aluminum powder,
    10-15 parts by weight of organic carrier and
    0.1-6 parts by weight of a mixed inorganic binder including glass powder, nanosized zinc powder, and nanosized molybdenum oxide, wherein
    the mixed inorganic binder is made by ball milling and drying processes;

the glass powder is bismuthate glass powder with particle sizes of 1-5 μm and a softening temperature in the range of 450-500° C.;

the nanosized zinc powder has a purity of more than 99.6% and particle sizes of 20-80 nm;

the nanosized molybdenum oxide has a purity more than 99.6% and particle sizes of 60-100 nm; and the mixed inorganic binder comprises 85-95 parts by weight of the bismuthate glass powder, 1-10 parts by weight of nanosized zinc powder, and 1-10 parts by weight of nanosized molybdenum oxide.

2. An aluminum paste according to claim 1, wherein the particle size of the aluminum powder is 0.3-0.8 μm, and the tap density of the aluminum powder is 1-3 g/cm$^3$.

3. An aluminum paste according to claim 1,
wherein the organic carrier comprises thickening agent, thixotropic agent, additive and solvent, wherein the thickening agent is one or more members of the group consisting of xylene resin, cellulose acetate propionate, cellulose acetate butyrate, phenolic modified cellulose, acrylic resin and nitro cellulose;

the thixotropic agent is one or two members of the group consisting of polyamide wax, polyethylene wax and organic bentonite;

the additive is a dispersing agent, or a coupling agent; and the solvent is one or two members of the group consisting of terpineol, butyl carbitol, propylene glycol monomethyl ether acetate, texanol and petroleum ether.

4. A method of preparing the aluminum paste according to claim 1, comprising:

weighing 85-95 parts by weight of aluminum powder, 10-15 parts by weight of organic carrier and 0.1-6 parts by weight of the inorganic binder;

mixing and dispersing with a dispersion machine at a speed of 500-2000 rpm for 1 h;

grinding with a three-roller grinding machine to a fineness less than 8 μm, wherein and viscosity of the paste is controlled within 80-100 Pas, which is measured with a Brookfield DV2T viscometer at 25° C.

5. A method including:
screen printing the aluminum paste prepared according to the method of claim 4 on notched areas in a back surface of a passivated waferwith the use of a 156 mm×156 mm 400 mesh screen; and sintering the screen printed aluminum paste to produce an aluminum gate line;

wherein after being sintered, the aluminum gate line has an aluminum gate line width within 50-100 μm and an aluminum gate line height within 18-25 μm.

* * * * *